United States Patent [19]

Campbell, Jr.

[11] Patent Number: 4,581,551
[45] Date of Patent: Apr. 8, 1986

[54] INPUT/OUTPUT CIRCUIT FOR USE WITH VARIOUS VOLTAGES

[75] Inventor: Jules D. Campbell, Jr., Austin, Tex.

[73] Assignee: Motorola, Inc., Schaumburg, Ill.

[21] Appl. No.: 594,140

[22] Filed: Mar. 28, 1984

[51] Int. Cl.$^4$ .............................................. H03K 17/08
[52] U.S. Cl. ................................ 307/475; 307/200 B; 307/446; 307/359; 307/270; 361/93; 361/101
[58] Field of Search ........... 307/200 R, 200 A, 200 B, 307/443, 446, 448, 454, 475, 494–497, 354–356, 358–359, 546–548, 264, 270, 297; 361/5, 7, 79, 87, 93, 100–101

[56] References Cited

U.S. PATENT DOCUMENTS

| | | | |
|---|---|---|---|
| 4,168,442 | 9/1979 | Satou et al. | 307/200 B X |
| 4,178,620 | 12/1979 | Yu | 307/200 B X |
| 4,275,313 | 6/1981 | Boll et al. | 307/475 X |
| 4,288,831 | 9/1981 | Dolikian | 307/200 A X |
| 4,306,163 | 12/1981 | Blume, Jr. et al. | 307/475 |
| 4,344,002 | 8/1982 | Chao | 307/475 X |
| 4,347,447 | 8/1982 | Proebsting | 307/448 X |
| 4,363,068 | 12/1982 | Burns | 307/200 B X |
| 4,413,194 | 11/1983 | Birch | 307/443 X |
| 4,479,067 | 10/1984 | Fujita | 307/448 X |
| 4,543,494 | 9/1985 | Wakimoto | 307/200 B |

OTHER PUBLICATIONS

Vicary, "Semiconductor Chip Layout of a Driver/-Receiver Circuit", IBM TDB vol. 19, No. 10, Mar. 1977, pp. 3739–3740.

Bayer et al., "FET to Bipolar Receiver with Overvoltage Protection", IBM TDB, vol. 18, No. 8, Jan. 1976, p. 2510.

Primary Examiner—Stanley D. Miller
Assistant Examiner—D. R. Hudspeth
Attorney, Agent, or Firm—Anthony J. Sarli, Jr.; Jeffrey Van Myers; Robert L. King

[57] ABSTRACT

An I/O circuit is provided having a terminal for either receiving an input signal or providing an output signal. In one form, the circuit may be utilized in a system with multiple I/O circuits coupled via a two-wire interconnection having a common ground conductor throughout the system. Input signal levels are sensed within a narrow voltage range referenced, in part, to the $V_{be}$ of a bipolar transistor and independent of the power supply voltage of other interconnected circuits. In response to an enable signal, a differential amplifier provides an output drive signal proportional to the difference between the signal at the terminal and a reference voltage. The output drive signal is coupled to a driver stage which provides a predetermined limited current at the terminal, thereby providing an output signal. A voltage limiter allows the circuit to use bipolar transistors in a P-well CMOS process and to receive input voltages greater than the supply voltage of the circuit.

12 Claims, 4 Drawing Figures

INPUT/OUTPUT CIRCUIT FOR USE WITH VARIOUS VOLTAGES

TECHNICAL FIELD

This invention relates generally to input/output circuits and, more particularly, to an input/output circuit which provides substantially uniform operation for various supply voltages.

BACKGROUND ART

An input/output (I/0) circuit is a circuit which has a single terminal which functions as both an input and an output. Numerous system applications exist where multiple I/0 circuits utilizing a variety of differing supply voltages are interconnected. One common application of I/0 circuits is in an alarm system which utilizes multiple smoke detector circuits which are typically powered by batteries. Usually, each alarm unit must be capable of both providing an alarm signal and receiving an alarm signal from any of the other units so that all alarms will be enabled if any one alarm is activated. Furthermore, in smoke detector applications, the possibility exists that the communication wire connecting the units will burn and place a ground potential or 'short circuit' on the output of one or more units. Without short circuit protection in the form of current limiting, an output drive transistor could dissipate excessive power, thereby damaging the circuit and rendering the circuit inoperative. Therefore, each I/0 circuit must be protected from possible electrical short circuits. Each I/0 circuit must also be able to both provide an alarm signal and sense an alarm from another unit while operating from a variety of power supply voltages. Therefore, close control of the logic level of the input signal for a wide range of power supply voltages is needed. The possibility of an I/0 circuit receiving an alarm signal having a voltage magnitude which is greater than the power supply voltage of the I/0 circuit also exists. A problem with known I/0 circuits which have been implemented in MOS technology is the lack of tight control of input signal logic levels over varying ranges of supply voltages. This typically results from the large variation of an MOS logic inverter trip point with supply voltage variation. Typical I/0 circuits do not have any output current limiting capability other than a resistor connected to an output terminal. Other known I/0 circuits have been implemented exclusively in bipolar process technology. However, analogous CMOS circuits cannot be built in a P-well CMOS process because an equivalent collector electrode cannot be fabricated. Another common characteristic of other I/0 circuits implemented in MOS processes is the requirement of a start-up circuit to obtain an output signal. Start-up circuitry increases the size and complexity of an I/0 circuit.

SUMMARY OF THE INVENTION

It is an object of the present invention to provide an improved input/output circuit capable of receiving and providing signals via a single terminal.

Another object of the present invention is to provide an improved input/output circuit having substantially uniform circuit operation in response to differing power supply voltages.

A further object of the present invention is to provide an input/output circuit having improved short circuit protection.

Yet another object of the present invention is to provide an improved input/output circuit having a current limiting output with improved control of input logic levels during power supply variation.

In carrying out the above and other objects of the present invention, there is provided, in one form, an input/output circuit having a terminal for either receiving an input signal or providing an output signal. Differential amplifier means are provided having a noninverting input coupled to the terminal, an inverting input, and an output. The differential amplifier is fabricated to have a predetermined offset voltage to provide self-starting of the circuit. Reference voltage means are coupled between the inverting input of the differential amplifier means and an output terminal of output driver means. The output driver means provide an output driver signal to the terminal in response to both the output of the differential amplifier and an output enable signal. The reference voltage means couple an input voltage having a predetermined relationship to the magnitude of the driver output signal to the inverting input of the differential amplifier means. Current sensing means are coupled between the terminal and the output driver means for regulating the output signal from the driver means and for limiting current at the terminal.

The above and other objects, features and advantages of the present invention will be more clearly understood from the following detailed description taken in conjunction with the following drawings.

DETAILED DESCRIPTION OF THE PRESENT INVENTION

Figure 1:
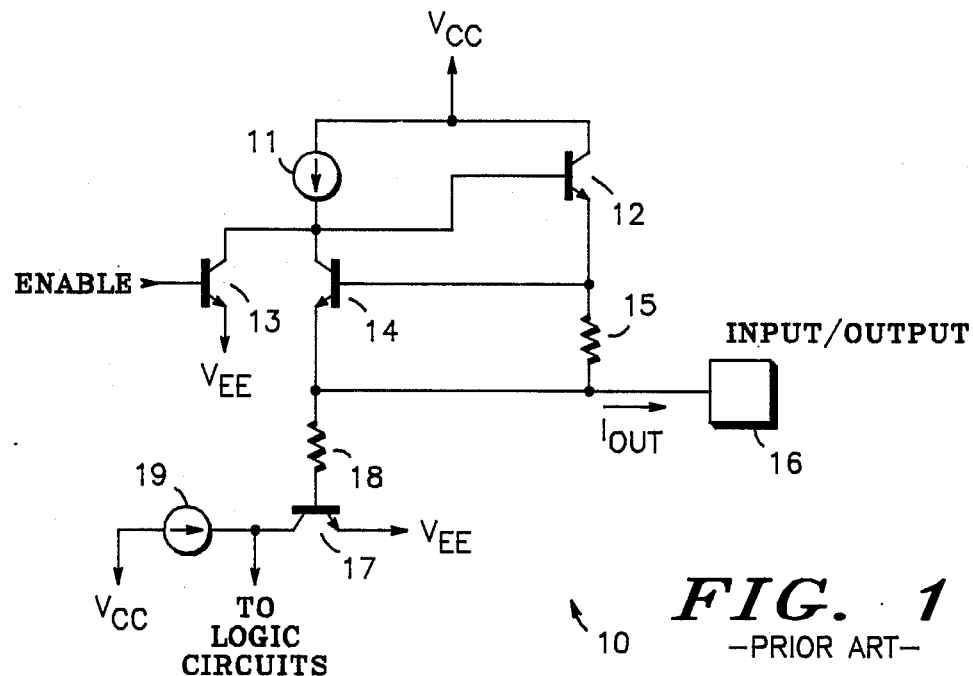
FIG. 1 illustrates in schematic form an input/output circuit known in the art.

Shown in FIG. 1 is an input/output circuit 10 known in the art and having a current source 11 with a first terminal connected to a supply voltage $V_{CC}$. A second terminal of current source 11 is connected to a base of an NPN bipolar transistor 12 and to collectors of NPN bipolar transistors 13 and 14. Bipolar transistor 12 has a collector connected to supply voltage $V_{CC}$ and an emitter connected to both the base of transistor 14 and a first terminal of a resistor 15. A base of transistor 13 is coupled to an enable control signal and an emitter of transistor 13 is connected to a supply voltage $V_{EE}$ which, by convention, is less positive than $V_{CC}$. An emitter of transistor 14 is connected to a second terminal of resistor 15 to form an input/output terminal 16. A base of an NPN bipolar transistor 17 is connected to a first terminal of a resistor 18. A second terminal of resistor 18 is connected to terminal 16. Bipolar transistor 17 has an emitter connected to supply voltage $V_{EE}$, and a collector connected to a first terminal of a current source 19 for providing logic signals which are coupled to logic circuits not shown. A second terminal of current source 19 is coupled to supply voltage $V_{CC}$.

In operation, current source 19 and transistor 17 function as an input circuit to receive voltages at terminal 16 and provide a corresponding logic signal to logic circuits when the enable signal is in a low logic state. Current source 11, transistors 12, 13 and 14, and resistor 15 function as an output circuit to provide an output current $I_{OUT}$ to terminal 16 when circuit 10 is enabled. Transistor 13 functions as a switch to enable circuit 10. When the voltage potential at the base of transistor 13 is approximately $V_{EE}$, transistor 13 is made nonconductive. In response thereto, current source 11 supplies current to the base of transistor 12 which makes transistor 12 conductive. The $V_{be}$ of transistor 14 functions as a reference voltage and is equal to the voltage across resistor 15. As the voltage at the first terminal of resistor 15 increases to approximately 0.7 volt greater than the voltage at the emitter of transistor 14, transistor 14 is made conductive and diverts current from the base of transistor 12. Because of current source 11, the current flowing in transistor 12 is significantly greater than the current flowing in transistor 14. Therefore, the output current, $I_{OUT}$, is substantially constant and substantially equal to the $V_{be}$ of transistor 14 divided by the resistance of resistor 15. The resulting value of the output current is much greater than the current provided by current source 11. The output current remains constant because the collector of transistor 12 has a large voltage compliance meaning that transistor 12 may be conductive for any base voltage within the supply voltage range. Therefore, circuit 10 functions as a current source which may accomodate any input or output voltage within a large percentage of the supply voltage range. When transistor 13 is enabled and circuit 10 is disabled, substantially no current flow exists at the input/output terminal. Transistor 13 will sink any collector/base current leakage of transistor 12 to supply voltage $V_{EE}$, and resistor 15 will sink any collector/base current leakage of transistor 14 to the voltage potential at terminal 16. Unfortunately, in a conventional P-well CMOS process, the circuit of FIG. 1 cannot be implemented because all collector electrodes must be connected to the positive supply voltage, commonly labeled $V_{DD}$, because bipolar transistors are parasitic structures in a P-well CMOS process. The parasitic transistor exists on an N diffusion and the collector is the substrate which is at $V_{DD}$ potential. This is because the collector/base junction is not intended to be forward biased and bipolar transistor action depends upon the base/emitter junction being forward biased. Furthermore, if resistor 15 is implemented with P+ material, a parasitic PNP into the substrate exists and may be easily damaged if the input voltage exceeds the supply voltage, $V_{DD}$.

Figure 2:
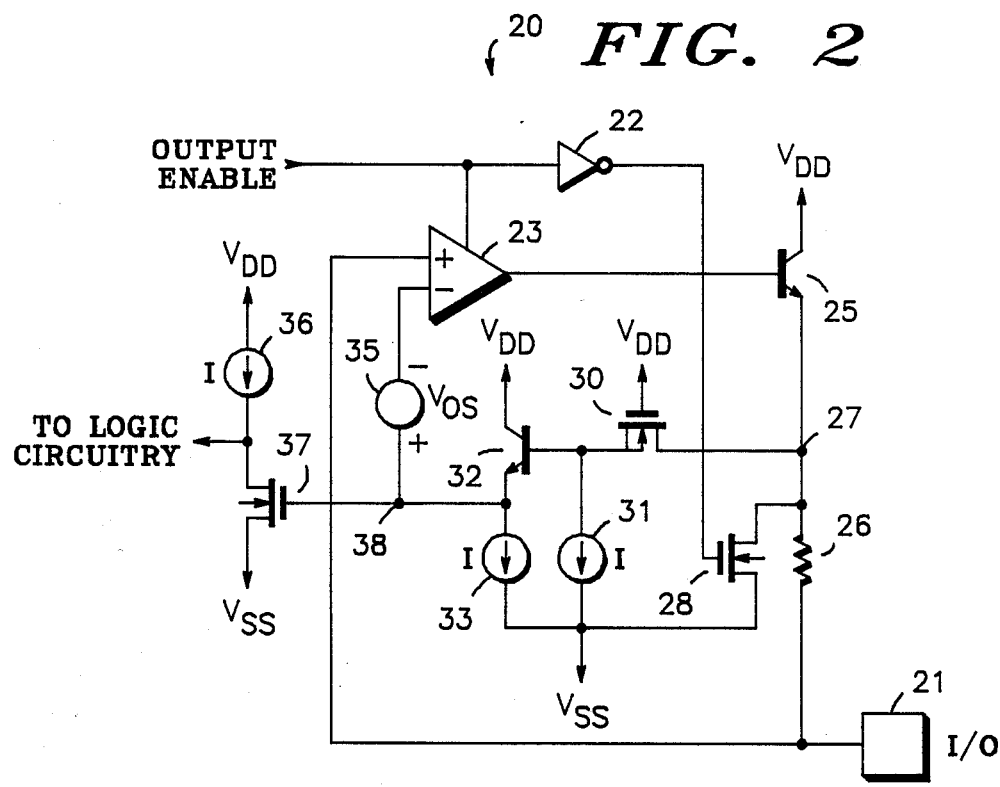
FIG. 2 illustrates in partial schematic form a diagram of an input/output circuit in accordance with the present invention.

Shown in FIG. 2 is a partial schematic diagram of a CMOS input/output circuit 20 for either receiving input signals or providing an output signal at an I/0 terminal 21. Circuit 20 typically utilizes a positive supply voltage of between five and eighteen volts. An output enable signal is coupled to an input of an inverter 22 and to the bias circuitry of a differential amplifier 23. A detailed description of the connection of the enable signal to differential amplifier 23 is described below. Differential amplifier 23 has a noninverting or positive input connected to terminal 21. An output of differential amplifier 23 is connected to a base of a bipolar NPN transistor 25. A collector of transistor 25 is connected to a power supply voltage $V_{DD}$ since bipolar transistors are parasitic structures in a P-well CMOS process as previously mentioned. An emitter of transistor 25 is connected to a first terminal of a resistor 26 at a node 27. A second terminal of resistor 26 is connected to terminal 21. An output of inverter 22 is connected to a gate of an N-channel transistor 28. A drain of transistor 28 is connected to node 27, and a source of transistor 28 is connected to a supply voltage $V_{SS}$ which is less positive than supply voltage $V_{DD}$. An N-channel transistor 30 has a drain connected to node 27, a gate connected to supply voltage $V_{DD}$, and a source connected to a first terminal of a current sink 31. In a preferred form, the source of transistor 30 is connected to the substrate thereof. A second terminal of current sink 31 is connected to supply voltage $V_{SS}$. A bipolar NPN transistor 32 has a base connected to the source of transistor 30, a collector connected to supply voltage $V_{DD}$, and an emitter connected to a first terminal of a current sink 33. A second terminal of current sink 33 is connected to supply voltage $V_{SS}$. An offset voltage which is associated with differential amplifier 23 is represented by a voltage source 35 having a negative terminal connected to an inverting or negative input of differential amplifier 23 and a positive terminal connected to the emitter of transistor 32. A current source 36 has a first terminal connected to supply voltage $V_{DD}$ and a second terminal connected to a drain of an N-channel transistor 37. The second terminal of current source 36 is coupled to other logic circuitry as a level processed input signal. A gate of transistor 37 is connected to the emitter of transistor 32 at a node 38, and a source of transistor 37 is connected to supply voltage $V_{SS}$.

Figure 3:
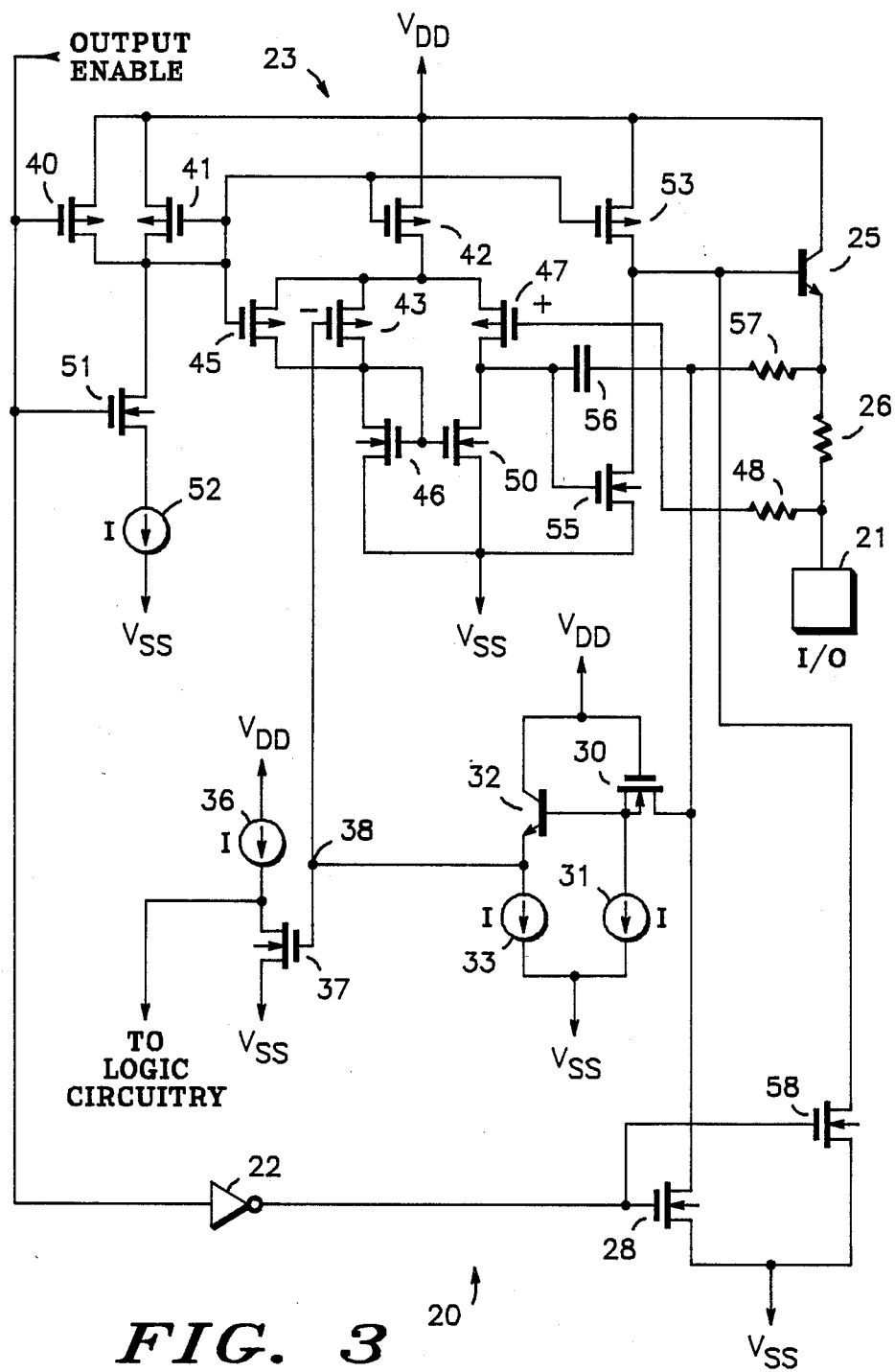
FIG. 3 illustrates in schematic form the input/output circuit of FIG. 2.

To further illustrate the interconnection of differential amplifier 23 with the remainder of circuit 20, FIG. 3 provides a detailed schematic diagram of the present invention as illustrated in FIG. 2. It should be noted that previously illustrated elements of FIG. 2 are shown in FIG. 3 by the same number. Differential amplifier 23 comprises a P-channel transistor 40 having a source coupled to supply voltage $V_{DD}$, a gate coupled to the output enable signal, and a drain. A P-channel transistor 41 has a source coupled to supply voltage $V_{DD}$, and a gate connected to both a drain thereof and the drain of transistor 40. A P-channel transistor 42 has a source coupled to supply voltage $V_{DD}$, a gate connected to the gate of transistor 41, and a drain. A P-channel transistor 43 has a source connected to the drain of transistor 42, a gate which functions as the inverting input of differential amplifier 23 connected to node 38, and a drain. A P-channel transistor 45 has a source connected to the source of transistor 43, a gate connected to the drains of transistors 40 and 41, and a drain connected to the drain of transistor 43. An N-channel transistor 46 has a drain connected to both a gate thereof and the drains of transistors 43 and 45. A source of transistor 46 is coupled to supply voltage $V_{SS}$. A P-channel transistor 47 has a source connected to the drain of transistor 42, a gate functioning as the noninverting input of differential amplifier 23 coupled to the first terminal of a resistor 48, and a drain connected to a drain of an N-channel transistor 50. A gate of transistor 50 is connected to the gate of transistor 46, and a source of transistor 50 is coupled to supply voltage $V_{SS}$. An N-channel transistor 51 has a drain connected to the drains of transistors 40 and 41, a gate connected to the output enable signal, and a source connected to a first terminal of a current sink 52. A second terminal of current sink 52 is coupled to supply voltage $V_{SS}$. A P-channel transistor 53 has a source coupled to supply voltage $V_{DD}$, a gate connected to the drains of transistors 40 and 41, and a drain connected to the base of NPN transistor 25. An N-channel transistor 55 has a drain connected to the drain of transistor 53, a gate connected to the drain of transistor 47, and a source coupled to supply voltage $V_{SS}$. A stabilizing capacitor 56 has a first electrode connected to the drain of transistor 47, and a second electrode connected to a first terminal of a resistor 57. A second terminal of resistor 57 is connected to the first terminal of resistor 26. An N-channel transistor 58 has a drain connected to the base of NPN transistor 25, a gate connected to the output of inverter 22, and a source coupled to supply voltage $V_{SS}$. The drain of transistor 28 is connected to the first terminal of resistor 57, to the second electrode of capacitor 56 and to the drain electrode of transistor 30. The gate of transistor 28 is connected to the output of inverter 22. The source of transistor 28 is coupled to supply voltage $V_{SS}$ as previously illustrated. The remaining circuit connections of elements shown in FIG. 2 are the same as previously described. While specific N-channel and P-channel MOS devices are shown in both FIGS. 2 and 3, it should be clear that circuit 20 could be implemented by completely reversing the processing techniques (e.g. P-channel to N-channel).

In operation, I/0 circuit 20 always functions as an input circuit capable of accepting input voltages at terminal 21. However, when the output enable signal is active and terminal 21 functions to provide an output signal, any input signal within the power supply range of of I/0 circuit 20 is overridden by the output signal. In a typical application, I/0 circuit 20 may be used in conjunction with multiple circuits such as circuit 20. In such an application, the multiple circuits are connected via a two-wire system where a ground or $V_{SS}$ conductor functions as a common conductor. Referring to FIG. 2, the input circuit portion of I/0 circuit 20 comprises current sources 36, 33 and 31, transistors 37, 32 and 30, resistor 26 and terminal 21. The output circuit portion of I/0 circuit 20 as illustrated in FIG. 2 comprises all the illustrated circuitry except current source 36 and transistor 37. When the output enable signal is at a low logic level, I/0 circuit 20 functions as an input circuit. Transistor 28 functions as a low output driver transistor and is made conductive by the output enable signal. Transistor 28 functions as a weak load device to circuits remotely coupled to terminal 21. Transistor 28 typically conducts current in the twenty to one-hundred microamp range for input voltages at terminal 21 between $V_{SS}$ and a few volts above $V_{DD}$. At this current level, the voltage drop across resistor 26 is negligible. Current sources 31 and 33 typically supply one and three microamps, respectively. The function of current sources 31 and 33 is to clamp the base and emitter voltages of transistor 32 to substantially $V_{SS}$ in the absence of an input signal at terminal 21.

When a non-zero voltage is coupled to terminal 21, current typically in the tens of microamps range will flow through transistor 28. When the voltage at terminal 21 reaches approximately 0.7 volt, the voltage at the emitter of transistor 32 will begin to follow the voltage at terminal 21. The threshold voltage of transistor 37 is approximately one volt. When the emitter voltage of transistor 32 reaches approximately one volt, transistor 37 is made conductive and conducts all of the current supplied by current source 36 to $V_{SS}$. Any voltage substantially less than 1.5 volts at terminal 21 will make transistor 37 nonconductive. Before transistor 37 is conductive, the logic value of the signal applied to other logic circuitry at the second terminal of current source 36 is a high logic level. When transistor 37 becomes conductive, the logic level appears as a low logic level to external logic circuitry. Regardless of the power supply voltage values utilized, the logic level of the signal supplied for external logic circuitry will be assured to change for input voltage values somewhere between 1.5 and 3 volts. In other words, an input voltage above 3 volts will always cause transistor 37 to be conductive and thereby couple a low logic level to external circuitry.

If the input voltage coupled to input terminal 21 is in a range from approximately one volt below $V_{DD}$ to a few volts above $V_{DD}$, the voltage at the source of transistor 30 will no longer be substantially the voltage at input terminal 21. Rather, the voltage at the source of transistor 30 is clamped at approximately one volt (the approximate threshold voltage of transistor 30) below supply voltage $V_{DD}$. Therefore, the voltage to the base of transistor 32 is limited by transistor 30 and current sink 31. This protects the P diffusion base of transistor 32 from damaging voltage levels of $V_{DD}$ or greater. In a preferred form, the substrate of transistor 30 is connected to the source thereof to keep the threshold voltage of transistor 30 substantially constant regardless of the voltage potential between $V_{SS}$ and the source of transistor 30. Otherwise, conventional substrate bias effects would raise the threshold voltage of transistor 30, and the source of transistor 30 would clamp at a lower voltage which is possibly within the common mode range of differential amplifier 23. Since the emitter voltage of transistor 32 is approximately 0.7 volt lower in potential than the source of transistor 30, the emitter voltage of transistor 32 is approximately 1.7 volts below $V_{DD}$. This is, however, insignificant since transistor 37 has already been made conductive by the input voltage at some value between 1.5 and 3.0 volts. Transistors 32 and 30 function as a reference voltage to couple a follower voltage to the inverting input of differential amplifier 23. The follower voltage is referenced by transistors 32 and 30 to follow the voltage at node 27 of FIG. 2 by a predetermined amount. Therefore, it should be well understood that the present invention may be practiced by utilizing other references other than the $V_{be}$ of transistor 32. During the operation of I/0 circuit 20 as an input circuit, differential amplifier 23 is disabled. Differential amplifier 23 keeps transistor 25 nonconductive by maintaining the base of transistor 25 at substantially $V_{SS}$. Any reverse emitter/base current through transistor 25 as a result of an applied input voltage is negligible.

Figure 4:
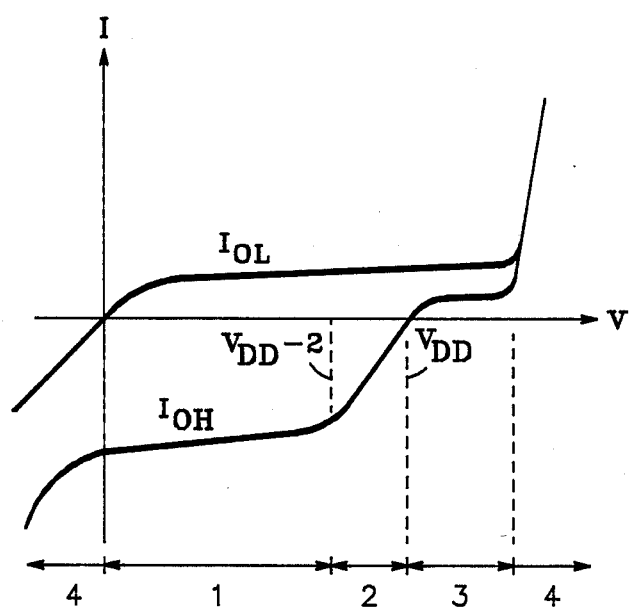
FIG. 4 illustrates in graphical form a current/voltage characteristic curve of a driver circuit portion of the circuits of FIGS. 2 and 3.

When the output enable signal changes from a low logic level to a high logic level, terminal 21 provides an output voltage and the output portion of I/0 circuit 20 is enabled. As can be readily seen, there is overlapping of circuitry between the input and output functions. Shown in FIG. 4 is a current/voltage characteristic curve of the driver circuit portion of I/0 circuit 20. Graphs illustrating the output current provided by drive transistors 28 and 25 are labeled "$I_{OL}$" and "$I_{OH}$", respectively. There are essentially four modes of output circuit operation depending upon the value of output voltage at terminal 21 in which circuit 20 is operating into relative to supply voltage $V_{DD}$ of circuit 20. The first range illustrated in FIG. 4 by "1" is when output terminal 21 is operating into either $V_{SS}$ or into a low impedance voltage which is within the common mode range of differential amplifier 23. When output terminal 21 is at $V_{SS}$, the output terminal may have become short circuited for one reason or another. In this mode, differential amplifier 23 is enabled. Initially, transistor 25, an output drive transistor, is nonconductive and the emitter of transistor 25 is at the same voltage potential as terminal 21 which is $V_{SS}$. As a result, transistor 30 and current source 31 function to couple zero volts to the base of transistor 32 maintaining transistor 32 nonconductive. Current source 33 maintains the emitter of transistor 32 at zero volts which is coupled to the negative or inverting input of differential amplifier 23. In a short circuit condition, the noninverting input of differential amplifier 23 is zero volts and the inverting input of differential amplifier 23 is at zero volts potential. Normally, differential amplifier 23 would be prevented from operating if the associated offset voltage were such that the noninverting input had to be higher in voltage potential to provide a positive output voltage. However, by using a built-in offset voltage, differential amplifier 23 is self-starting and functions as though the noninverting input has a higher voltage potential even if the inverting input falls anywhere from a few hundred millivolts higher or lower than the noninverting input. It should be readily apparent that offset voltage source 35 illustrated in FIG. 2 is internal to differential amplifier 23 and is accomplished, in part, by skewing the control electrode dimensions of transistors 43 and 47. Therefore, the intentional offset voltage insures that the output of differential amplifier 23 will become positive even when input terminal 21 is at $V_{SS}$. The positive output of differential amplifier 23 enables output drive transistor 25. As the emitter current of transistor 25 increases, the voltage drop across resistor 26 increases. When the voltage at the emitter of transistor 25 reaches approximately 0.7 volts above the voltage at terminal 21, the voltage at the emitter of 32 follows the voltage at the emitter of transistor 25 but approximately 0.7 volts lower. The offset voltage of differential amplifier 23 remains present at the inputs thereof. When the emitter voltage of transistor 25 reaches a voltage equal to the sum of the offset voltage and the base-emitter voltage of transistor 32, which is approximately one volt, differential amplifier 23 is ideally operating with a zero input voltage differential and will regulate base current to transistor 25. The output current is thereby regulated to prevent destruction of output driver transistors 25. Resistor 26 also functions as an input protection resistor to guard transistors 25, 28 and 30 against electrostatic discharge. Because current limit protection is required for terminal potentials closer to $V_{SS}$, P-channel input MOSFETs are used in differential amplifier 23.

When the output terminal 21 is not short circuited and driver transistors 25 and 28 are operating into a low impedance voltage within the common mode range of differential amplifier 23, circuit operation for a high level output enable signal is analogous to the operation previously detailed. The voltage of the noninverting input of differential amplifier 23 is the voltage at terminal 21. Initially, when differential amplifier 23 is enabled by the output enable signal, voltage at the inverting input is approximately 0.7 volt below the voltage at terminal 21 or at zero volts, whichever is higher. By virtue of the built-in intentional offset voltage, differential amplifier 23 provides a positive output voltage to bias transistor 25. As the emitter current of transistor 25 increases, the voltage drop across resistor 26 increases. Resistor 26 functions as a current sensing device. When the voltage across resistor 26 reaches the sum of the offset voltage and the base-emitter voltage of transistor 32, approximately one volt, differential amplifier 23 is balanced. The base current to transistor 25 will be regulated to maintain the balanced condition. This mode of operation occurs for any voltage within the common mode range of differential amplifier which is within range 1 of FIG. 4. Typical common mode ranges extend from $V_{SS}$, or zero, to approximately ($V_{DD}-2$) volts.

When the output enable signal is at a high logic level and the voltage on terminal 21 into which driver transistors 25 and 28 are operating is above the common mode range of differential amplifier but less than $V_{DD}$ volts, circuit 20 is in mode 2 illustrated in FIG. 4. In this mode, differential amplifier 23 does not exhibit completely predictable behavior. Transistor 42 of FIG. 3 which functions as a current source drops out of saturation resulting in gain loss. To prevent gain loss, transistor 45 is connected as a shunt across transistor 43. In other words, when the gate voltages of either transistor 43 or 47 is higher than the gate voltage of transistor 45, transistor 45 will direct a substantial amount of current from transistor 42 into transistor 46. The gate of transistor 55 will then be driven to approximately zero volts by transistor 50. All the bias current from transistor 53 is then coupled to the base of output transistor 25. Although current limiting is not provided by differential amplifier 23 under these circuit conditions, resistor 26 which is in series with transistor 25 provides short circuit protection. Therefore, when differential amplifier 23 goes out of common mode range, the current limiting is provided by the low drain voltage of bias transistor 53 reducing the base current to output transistor 25 and the voltage drop across resistor 26. A transition from within common mode range operation to outside of common mode range is generally smooth with no discontinuous or abrupt change in the current limiting value.

When the output enable signal is at a high logic level and the voltage on terminal 21 into which driver transistors 25 and 28 are operating is above $V_{DD}$ volts, circuit 20 is in mode 3 illustrated in FIG. 4. In this mode, no current flows from I/0 circuit 20 and differential amplifier 23 is virtually disabled. Transistor 53 in FIG. 3 is strongly conductive. However, there is no drain current in transistor 53 because the base of transistor 25 is at substantially $V_{DD}$ and the emitter of transistor 25 is at or above $V_{DD}$. Since the output enable signal is at a high level, transistors 58 and 28 are disabled. Only a small input current exists at output terminal 21 by virtue of current source 31 being coupled to terminal 21 via transistor 30 and resistor 26.

When the output enable signal is at a high logic level and the voltage on terminal 21 into which driver transistors 25 and 28 are operating is substantially above $V_{DD}$ volts or below $V_{SS}$ volts, circuit 20 is in mode 4 illustrated in FIG. 4. In this mode, if a potential of less than $V_{SS}$ is placed on output terminal 21, the junctions associated with the N+ diffusions of resistors 26, 48 and 57 forward bias and the emitter of transistor 25 forward biases. The only time this circuit condition would occur would be from an extreme noise induced transient. If a voltage potential greater than the reverse junction breakdown of the N+/P− diffusions is presented at output terminal 21, high currents would be experienced in various paths of I/0 circuit 20. Such a damaging voltage typically would have to be approximately twenty-five volts. This type of voltage also does not occur during normal operation. Therefore, the acceptable voltage range for output terminal 21 is between $V_{SS}$ and approximately twenty-five volts.

By now it should be apparent that an input/output circuit which permits input voltages exceeding the local power supply voltage and protects the output from damage due to short-circuiting has been provided. A bipolar output drive structure is provided which requires no start-up circuitry. The I/0 circuit of the present invention allows tight control of input signal logic levels for a wide range of supply voltage. In the illustrated form, the I/0 circuit is parasitic free because there are no parasitic nodes and no parasitic device junctions.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An input/output circuit having a terminal for either receiving an input signal or providing an output signal, comprising:
   differential amplifier means having a noninverting input coupled to the terminal, an inverting input, and an output, the differential amplifier having a predetermined offset voltage between the noninverting and inverting inputs and providing in response to a control signal an output voltage which is proportional to a differential input voltage potential between the inverting and noninverting inputs;
   output driver means having an output, for providing a driver output signal in response to both the output voltage of the differential amplifier and an output enable signal;
   current sensing means coupled between the terminal and the output of the output driver means, for regulating the driver output signal and limiting current at the terminal; and
   reference voltage means coupled between the inverting input of the differential amplifier means and the output of the output driver means, for coupling an input voltage having a predetermined relationship to the magnitude of the driver output signal to the inverting input of the differential amplifier means.

2. The circuit of claim 1 wherein said reference voltage means comprise:
   voltage limiting means having an input coupled to the output of the output driver means, for limiting voltage to an output of the voltage limiting means; and
   voltage follower means having an input coupled to the output of the voltage limiting means, and an output coupled to the inverting input of the differential amplifier means, for providing a follower voltage having a magnitude related to the magnitude of the driver output signal.

3. The circuit of claim 2 further comprising:
   inverter means having an input coupled to the output of the voltage follower means, and an output for providing a logic signal indicative of the logic level of the voltage at the terminal.

4. The circuit of claim 2 wherein the voltage follower means is a transistor follower comprising:
   a transistor having a first current electrode coupled to a first supply voltage, a control electrode coupled to the output of the voltage limiting means, and a second current electrode; and
   a current sink having a first terminal coupled to the second current electrode of the transistor, and a second terminal coupled to a second supply voltage.

5. The circuit of claim 4 wherein the transistor is a bipolar NPN transistor.

6. The circuit of claim 2 wherein the voltage limiting means comprise:
   a transistor having a first current electrode coupled to the output of the driver means, a second current electrode coupled to the input of the the voltage follower means, and a control electrode coupled to a predetermined voltage.

7. The circuit of claim 6 wherein the transistor is an N-channel MOS field-effect transistor.

8. The circuit of claim 1 wherein the current sensing means further comprise:
   a current sensing resistor having a first resistor terminal coupled to the output of the output driver means, and a second resistor terminal coupled to the terminal.

9. The circuit of claim 1 wherein the output driver means comprise:
   a first transistor having a first current electrode coupled to a first supply voltage, a second current electrode coupled to the current sensing means, and a control electrode coupled to the output of the differential amplifier means; and
   a second transistor having a first current electrode coupled to the current sensing means, a second current electrode coupled to a second supply voltage, and a control electrode coupled to the control signal.

10. An input/output circuit having a terminal for either receiving an input signal or providing an output signal, comprising:
    a differential amplifier having a noninverting input coupled to the terminal, an inverting input, and an output, for providing, in response to an enable signal, an output signal which is proportional to a difference in input voltage potential between the inverting and noninverting inputs;
    a first transistor coupled to the differential amplifier for selectively providing a first driver output signal in response to the output signal of the differential amplifier means;
    a second transistor coupled to a supply voltage terminal for selectively providing a second driver output signal in response to the enable signal;
    current sensing means having a first terminal coupled to both the first and second transistors, and a second terminal coupled to the terminal, for regulating the first and second driver output signals and for limiting current at the terminal; and
    reference voltage means coupled between the first terminal of the current sensing means and the inverting input of the differential amplifier means, said reference voltage means having a voltage follower for providing a follower voltage having a magnitude related to the magnitude of the first and second driver output signals to the inverting input of the differential amplifier means.

11. The circuit of claim 10 wherein said first transistor is a bipolar NPN transistor.

12. The circuit of claim 10 further comprising:
    inverter means having an input coupled to the follower voltage of the reference voltage means, and an output for providing a logic signal indicative of the logic level of the voltage at the terminal.

* * * * *